United States Patent
Yoshimine

(10) Patent No.: US 8,754,324 B2
(45) Date of Patent: Jun. 17, 2014

(54) SOLAR CELL MODULE

(75) Inventor: Yukihiro Yoshimine, Kobe (JP)

(73) Assignee: Sanyo Electric Co., Ltd., Moriguchi-shi (JP)

(*) Notice: Subject to any disclaimer, the term of this patent is extended or adjusted under 35 U.S.C. 154(b) by 783 days.

(21) Appl. No.: 12/516,218

(22) PCT Filed: Nov. 26, 2007

(86) PCT No.: PCT/JP2007/072756
§ 371 (c)(1),
(2), (4) Date: Jun. 23, 2009

(87) PCT Pub. No.: WO2008/069035
PCT Pub. Date: Jun. 12, 2008

(65) Prior Publication Data
US 2010/0032000 A1    Feb. 11, 2010

(30) Foreign Application Priority Data
Nov. 28, 2006  (JP) ................. 2006-320219

(51) Int. Cl.
*H01L 31/00* (2006.01)
(52) U.S. Cl.
USPC ........................................ 136/256; 136/244
(58) Field of Classification Search
CPC ............ H01L 31/022433; H01L 31/05; H01L 31/0512
USPC ................................. 136/244, 256
See application file for complete search history.

(56) References Cited

U.S. PATENT DOCUMENTS

| | | | |
|---|---|---|---|
| 5,340,409 A * | 8/1994 | Tsuzuki et al. | 136/256 |
| 6,328,844 B1 | 12/2001 | Watanabe et al. | |
| 2003/0174273 A1* | 9/2003 | Matsui et al. | 349/151 |
| 2004/0177878 A1* | 9/2004 | Maruyama | 136/256 |
| 2005/0224108 A1* | 10/2005 | Cheung | 136/251 |
| 2009/0288697 A1* | 11/2009 | Shimizu et al. | 136/244 |

FOREIGN PATENT DOCUMENTS

| | | | |
|---|---|---|---|
| JP | 62-068874 A | | 3/1987 |
| JP | 06-244520 A | | 9/1994 |
| JP | 08-100106 A | | 4/1996 |
| JP | 2001-085083 A | | 3/2001 |
| JP | 2002-008455 A | | 1/2002 |
| JP | 2005-101519 A | | 4/2005 |
| JP | 2005-252082 A | | 9/2005 |
| JP | 2005-294679 A | | 10/2005 |
| JP | 2006-073668 A | | 3/2006 |
| JP | 2006-073811 A | | 3/2006 |
| JP | 3123842 U | | 7/2006 |
| JP | 2006-291220 A | | 10/2006 |
| JP | 2007-214533 A | | 8/2007 |
| JP | 2007214533 A | * | 8/2007 |
| WO | WO98/03047 A1 | | 1/1998 |

* cited by examiner

*Primary Examiner* — Eli Mekhlin
(74) *Attorney, Agent, or Firm* — Marvin A. Motsenbocker; Mots Law, PLLC

(57) ABSTRACT

Provided is a solar cell module capable of restraining a decrease in the module output. In the solar cell module, a plurality of solar cells are arranged between a light-receiving surface protection member 40 and a back-surface protection member 60, and electrodes 10, 30 of the solar cells are electrically connected to each other through wiring members 70. Each of the electrodes 10, 30 includes a bus bar electrode formed of a resin-type conductive paste. The solar cell module includes an adhesive layer made of a resin 90 between the bus bar electrode and the wiring member 70. Moreover, the residual stress of the resin 90 of the adhesive layer is smaller than the residual stress of a resin contained in the bus bar electrode.

9 Claims, 2 Drawing Sheets

SOLAR CELL MODULE

TECHNICAL FIELD

The present invention relates to a solar cell module in which a plurality of solar cells, electrically connected to each other through wiring members, are arranged between a light-receiving surface protection member and a back-surface protection member.

BACKGROUND ART

Conventionally, in a solar cell module, wiring members are soldered onto electrodes respectively of a plurality of solar cells to electrically connect the solar cells to each other. In many cases, each of the electrodes is formed of a conductive paste, and copper foil coated with solder is used as the wiring member. When the electrode is soldered to the wiring member, the conductive paste and the solder form an alloy layer to electrically connect the electrode and the wiring member to each other. Additionally, flux is applied to the surface of the conductive paste and to the surface of the wiring member at the solar cell side to facilitate the soldering (see, for example, Patent Document 1).
Patent Document 1: JP-A 2005-101519

DISCLOSURE OF THE INVENTION

In the conventional solar cell module, however, a thermally-damaged resin, a flux residue, and the like accumulate in the alloy layer formed by soldering the electrode and the wiring member. This increases the resistance value between the electrode and the wiring member. As a result, the output of the solar cell module is reduced.

Furthermore, stress is concentrated in and around the alloy layer because of the difference in thermal expansion coefficient between the conductive paste and the alloy layer and the difference in thermal expansion coefficient between the solar cell and the wiring member (copper foil). Accordingly, damage, an adhesion reduction, and the like occur in the portions where the stress is concentrated. When the damage, the adhesion reduction, and the like occur in this manner, the resistance value between the electrode and the wiring member is increased. As a result, the output of the solar cell module is reduced.

Therefore, in view of the above-described problem, an object of the present invention is to provide a solar cell module capable of restraining a decrease in the module output.

An aspect of the present invention provides a solar cell module in which a plurality of solar cells is arranged between a light-receiving surface protection member and a back-surface protection member and in which electrodes of the solar cells are electrically connected to each other through wiring member, wherein each of the electrodes includes a bus bar electrode formed of a resin-type conductive paste, an adhesive layer made of a resin is formed between the bus bar electrode and the wiring member, and a residual stress of the resin of the adhesive layer is smaller than a residual stress of a resin contained in the bus bar electrode.

Moreover, in the solar cell module according to the aspect of the present invention, an average molecular weight of the resin of the adhesive layer is preferably higher than an average molecular weight of the resin contained in the bus bar electrode, and thus the residual stress of the resin of the adhesive layer is smaller than the residual stress of the resin contained in the bus bar electrode.

Moreover, in the solar cell module according to the aspect of the present invention, the resin of the adhesive layer is preferably any one of an epoxy resin, an imide resin and a phenol resin with an elastomer mixed thereinto, and thus has the residual stress smaller than the residual stress of the resin contained in the bus bar electrode.

Moreover, in the solar cell module according to the aspect of the present invention, the resin of the adhesive layer preferably has a sea-island structure having a rigid adhesive resin as a main skeleton with a resin, incompatible with the rigid adhesive resin, being added thereto, and thus has the residual stress smaller than the residual stress of the resin contained in the bus bar electrode.

Moreover, in the solar cell module according to the aspect of the present invention, the resin of the adhesive layer has preferably a soft molecular skeleton introduced into a main skeleton of a rigid adhesive resin, and thus has the residual stress smaller than the residual stress of the resin contained in the bus bar electrode.

Moreover, another aspect of the present invention provides a solar cell module in which a plurality of solar cells is arranged between a light-receiving surface protection member and a back-surface protection member and in which electrodes of the solar cells are electrically connected to each other through wiring member, wherein each of the electrodes includes a bus bar electrode formed of a resin-type conductive paste, an adhesive layer made of a resin is formed between the bus bar electrode and the wiring member, and an average molecular weight of the resin of the adhesive layer is higher than an average molecular weight of a resin contained in the bus bar electrode.

Moreover, another aspect of the present invention provides a solar cell module in which a plurality of solar cells is arranged between a light-receiving surface protection member and a back-surface protection member and in which electrodes of the solar cells are electrically connected to each other through wiring member, wherein each of the electrodes includes a bus bar electrode formed of a resin-type conductive paste, an adhesive layer made of a resin is formed between the bus bar electrode and the wiring member, and the resin of the adhesive layer is any one of an epoxy resin, an imide resin and a phenol resin with an elastomer mixed thereinto.

Moreover, another aspect of the present invention provides a solar cell module in which a plurality of solar cells is arranged between a light-receiving surface protection member and a back-surface protection member and in which electrodes of the solar cells are electrically connected to each other through wiring member, wherein each of the electrodes includes a bus bar electrode formed of a resin-type conductive paste, an adhesive layer made of a resin is formed between the bus bar electrode and the wiring member, and the resin of the adhesive layer has a sea-island structure having a rigid adhesive resin as a main skeleton with a resin, incompatible with the rigid adhesive resin, being added thereto.

Moreover, another aspect of the present invention provides a solar cell module in which a plurality of solar cells is arranged between a light-receiving surface protection member and a back-surface protection member and in which electrodes of the solar cells are electrically connected to each other through wiring member, wherein each of the electrodes includes a bus bar electrode formed of a resin-type conductive paste, an adhesive layer made of a resin is formed between the bus bar electrode and the wiring member, and the resin of the adhesive layer has a soft molecular skeleton introduced into a main skeleton of a rigid adhesive resin.

BEST MODES FOR CARRYING OUT THE INVENTION

Hereinafter, embodiments of the present invention are described with reference to the drawings. In the following description on the drawings, identical or similar components are denoted by identical or similar reference symbols. It should be noted, however, that the drawings are schematic, and that the dimensional proportions and the like are different from their actual values. Accordingly, specific dimensions and the like should be determined on the basis of the description given below. Moreover, it goes without saying that dimensional relationships and dimensional proportions may be different from one drawing to another in some parts.

1. Configuration of Solar Cell

Figure 1:
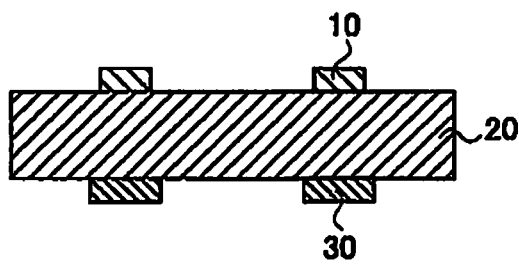
FIG. 1 is a cross-sectional view of a solar cell according to the present embodiment.

FIG. 1 is a configuration diagram of a solar cell constituting a solar cell module according to the present embodiment. As shown in FIG. 1, the solar cell includes a silicon wafer 20 and electrodes 10, 30 respectively provided on two surfaces of the silicon wafer 20 (a light-receiving surface and a back surface provided on the opposite side of the light-receiving surface). The electrodes 10, 30 are made of a silver paste. At least the electrode at the light-receiving surface side collects carriers generated in the solar cell. One solar cell is connected to another solar cell in series through a wiring member soldered to the electrode at the light-receiving surface of the one solar cell. The electrodes 10, 30 each have bus bar electrodes and finger electrodes.

2. Configuration of Solar Cell Module

Figure 2:
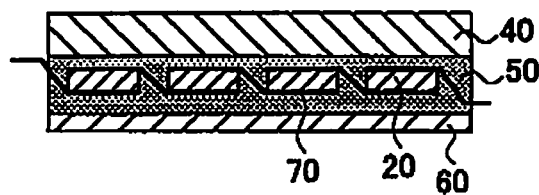
FIG. 2 is a cross-sectional view of a solar cell module according to the present embodiment.

FIG. 2 is a configuration diagram of the solar cell module according to the present embodiment. As shown in FIG. 2, the plurality of solar cells electrically connected to each other through the wiring members is arranged in the solar cell module. The electrode 10 of one solar cell and the electrode 30 of another solar cell neighboring the one solar cell are electrically connected through a wiring member 70 in series or in parallel. Moreover, the plurality of solar cells is sealed by a sealing member 50 made of a resin. A light-receiving surface protection member 40 is disposed at the light-receiving surface side of the solar cells, while a back-surface protection member 60 is disposed at the back surface side provided on the opposite side of the light-receiving surface. Furthermore, in order to increase the strength of the solar cell module and to firmly fix the solar cell module to an abutment, an Al frame may be attached around the solar cell module.

A glass or the like is suitable as the light-receiving surface protection member 40. A film used as the back-surface protection member 60 is formed of a metal foil such as Al being sandwiched by PET films or the like. Moreover, EVA, EEA, PVB, silicone, urethane, acrylic, epoxy, or the like is used as the sealing member 50.

3. Interface Between Solar Cell and Wiring Member

Figure 3:
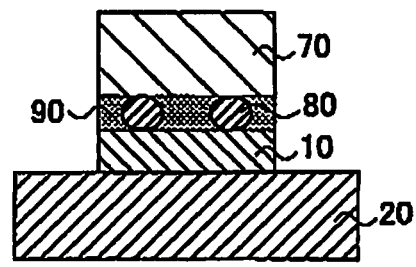
FIG. 3 is an enlarged cross-sectional view of the solar cell according to the present embodiment.

FIG. 3 is an enlarged cross-sectional view of the interface between the solar cell and the wiring member 70. An adhesive layer is disposed between the bus bar electrode of the electrode 10 and the wiring member 70. The adhesive layer is made of a resin 90 containing a plurality of conductive particles 80. For example, Al is used as the conductive particle 80. Besides, the conductive particle 80 may be a conductive powder such as carbon powder in addition to a metal powder such as copper, indium, lead, nickel, or the like. Furthermore, an alloy material or a resin particle such as epoxy, acrylic, polyimide, and a phenol resin, whose surface is coated with a metal film, can be used as the conductive particle 80.

Meanwhile, an example of the resin 90 of the adhesive layer is an epoxy resin. Particularly, the resin 90 of the adhesive layer is formed to have a residual stress smaller than a residual stress of a resin contained in the bus bar electrode. Hereinbelow, description is given of approaches to make the residual stress of the resin 90 of the adhesive layer smaller than the residual stress of the resin contained in the bus bar electrode.

3-1. Adjustment of Average Molecular Weight

In reducing the residual stress of the resin 90, it is easy to adjust the average molecular weight. The residual stress of, for example, an epoxy resin after hardening is substantially proportional to the density of the epoxy group. Accordingly, as the average molecular weight of the resin 90 is for example doubled, the density of the epoxy group is reduced by half. As a result, the residual stress is also reduced by approximately half. Thus, by making the average molecular weight of the resin 90 of the adhesive layer higher than the average molecular weight of the resin contained in the bus bar electrode, the residual stress of the resin 90 of the adhesive layer can easily be made smaller than the residual stress of the resin contained in the bus bar electrode.

Here, the average molecular weight can be measured by using Fourier transform infrared spectroscopy (FTIR) or Nuclear Magnetic Resonance (NMR) analysis method. Incidentally, in this case, the comparison of the average molecular weight between the resin 90 of the adhesive layer and the resin contained in the bus bar electrode is preferably performed when the resins are made of the same kind of resin.

3-2. Resin Modification

Furthermore, in reducing the residual stress of the resin 90, resin modification may be employed. Specifically, any one of an epoxy resin, an imide resin and a phenol resin, any of which is mixed with an elastomer, may be used as the resin 90 of the adhesive layer. Here, a flexible resin (for example, a synthetic rubber or the like) can be used as the elastomer. By mixing the resin with the elastomer, the soft resin 90 is formed. When such a resin 90 is used in the adhesive layer, a planetary mixer or three-roll mill may be used to mix and knead the two.

Here, the softness of the resin 90 can be adjusted on the basis of the density of the elastomer in the resin 90. The density of the elastomer can be measured by using Fourier transform infrared spectroscopy (FTIR).

3-3. Formation of Sea-Island Structure

Moreover, a resin with a sea-island structure having a rigid adhesive resin as the main skeleton with a resin, incompatible with this, being added thereinto may be used as the resin 90 of the adhesive layer. Here, examples of the rigid adhesive resin include an epoxy resin, an imide resin, and a phenol resin, and examples of the incompatible resin include silicone, an acrylic resin and polyester. As similar to the above, when such a resin 90 is used in the adhesive layer, a planetary mixer or three-roll mill may be used to mix and knead the two.

Here, the softness of the resin 90 can be adjusted by changing the proportion of the incompatible resin to the rigid adhesive resin. The proportion of the incompatible resin can be measured on the basis of the area ratio relative to the rigid adhesive resin in the cross section of the resin 90 by using Transmission electron microscopy (TEM) or Scanning electron microscopy (SEM).

3-4. Introduction of Soft Molecular Skeleton

Furthermore, a resin having a soft molecular skeleton of a soft material introduced into a main skeleton of a rigid adhesive resin may be used as the resin 90. Here, examples of the rigid adhesive resin include an epoxy resin, an imide resin, and a phenol resin, and examples of the soft material include a urethane resin and an elastomer. When such a resin 90 is used in the adhesive layer, the respective monomers of the rigid adhesive resin and of the soft material should be mixed and kneaded upon polymerization reaction from the monomers to a polymer. Thereby, the monomer of the rigid adhesive resin and the monomer of the elastomer are combined to form the resin 90 softer than the rigid adhesive resin.

Here, the softness of the resin 90 can be adjusted by changing the proportion of the soft material in the resin 90. The proportion of the soft material can be measured by using Fourier transform infrared spectroscopy (FTIR) or Nuclear Magnetic Resonance (NMR) analysis method.

4. Effects and Advantages

As described above, the solar cell module according to the present embodiment has the following advantages as compared to a conventional technique.

Conventionally, a thermally-damaged resin, a flux residue, and the like accumulate in an alloy layer formed after soldering. This leads to increase in resistance value between the electrode and the wiring member, and reduces the output of the solar cell module.

Moreover, stress generated during a temperature cycle test and similar occasions is concentrated in and around the alloy layer because of not only the difference in thermal expansion coefficient between the silver paste and the alloy layer but also the difference in thermal expansion coefficient between a solar cell including a silicon wafer and copper foil used as the wiring member. As a result, the decrease in the output of the solar cell module is caused.

This phenomenon is more apparently shown when a ceramic-type silver paste having a high hardness and a low flexibility is used. However, even when a silver paste having a high flexibility is used, the above phenomenon appears. Presumably, this is caused by the reduced resin flexibility at the thermally-deteriorated resin portion, resulting in insufficient relaxation of the stress occurring because of the thermal expansion between the wiring member and the solar cell (silicon wafer).

This reliability problem becomes more apparent when the temperature of soldering the wiring member is increased along with the lead-free practice, or when the cross-sectional area of the wiring member is increased to reduce the resistance loss at the time of modularization. To put it differently, the conventional soldering method has a problem of the decreased module output after a long period of use.

The above problems can be solved by applying a resin-type conductive paste onto a bus bar electrode, the resin-type conductive paste serving as an adhesive layer between the wiring member 70 and the solar cell, then by disposing the wiring member 70 on the resin-type conductive paste, and by hardening the resin paste to thus electrically connect the solar cell to the wiring member 70. However, a resin-type silver paste used as a collecting electrode of the solar cell needs to be low in resistance. The silver particles in such a paste need to be attracted to each other more strongly, accordingly increasing the internal stress.

Thus, in the present embodiment, the adhesive layer made of the resin 90 containing the plurality of conductive particles 80 is provided between the bus bar electrode and the wiring member 70, and the residual stress of the resin 90 of the adhesive layer is made smaller than the residual stress of the resin contained in the bus bar electrode. This eliminates the need of soldering, and thus an alloy layer in which a thermally-damaged resin, a flux residue, and the like accumulate is not formed. Furthermore, since the residual stress of the resin 90 of the adhesive layer is smaller than the residual stress of the resin contained in the bus bar electrode, the adhesive layer functions as a stress-relaxing layer. This restrains the damage, the decrease in adhesion, and the like of the adhesive layer and the bus bar electrode. Therefore, the decrease in the output of the solar cell module can be restrained. Note that, since the adhesive layer adheres to the wiring member 70 with the resin 90, the adhesive layer has a resin amount larger than that of the resin-type paste for forming the bus bar electrode.

Meanwhile, by making the average molecular weight of the resin 90 of the adhesive layer higher than the average molecular weight of the resin contained in the bus bar electrode, the residual stress of the resin 90 of the adhesive layer is made smaller than the residual stress of the resin contained in the bus bar electrode. Here, the residual stress of, for example, an epoxy resin after hardening is substantially proportional to the density of the epoxy group. Accordingly, as the average molecular weight of the resin is for example doubled, the density of the epoxy group is reduced by half, and the residual stress is also reduced by approximately half. Thus, by making the average molecular weight of the resin 90 of the adhesive layer lower than the average molecular weight of the resin contained in the bus bar electrode, the residual stress of the resin 90 of the adhesive layer can easily be made smaller than the residual stress of the resin contained in the bus bar electrode.

Meanwhile, the resin 90 of the adhesive layer is any one of an epoxy resin, an imide resin and a phenol resin with an elastomer mixed thereinto. Thereby, the residual stress of the resin 90 of the adhesive layer is made smaller than the residual stress of the resin contained in the bus bar electrode. By mixing a flexible resin into a rigid adhesive resin, the residual stress of the resin 90 of the adhesive layer can easily be reduced.

Meanwhile, the resin 90 of the adhesive layer is made to have a sea-island structure having a rigid adhesive resin as the main skeleton with a resin, incompatible with this, being added thereto. Thereby, the residual stress of the resin 90 of the adhesive layer is made smaller than the residual stress of the resin contained in the bus bar electrode. By forming the sea-island structure in this manner, the incompatible island portion relaxes the stress. As a result, the residual stress of the resin 90 of the adhesive layer can easily be reduced.

Meanwhile, the resin 90 of the adhesive layer is formed by introducing a soft molecular skeleton into the main skeleton of a rigid adhesive resin. Thereby, the residual stress of the resin 90 of the adhesive layer is made smaller than the residual stress of the resin contained in the bus bar electrode. Thus, the stress of the resin of the adhesive layer can be reduced at a molecular level.

5. Other Embodiments

The present invention has been described on the basis of the aforementioned embodiment. However, the description and the drawings constituting parts of this disclosure are not construed to limit the invention. Various alternative embodiments, examples, and operation technologies will be obvious to those skilled in the art from this disclosure.

For example, although the description has been given that the collecting electrode is the silver paste in the above-described embodiment, the main component of the collecting electrode is not limited to this. Meanwhile, individual electrical paths between the bus bar electrode and the wiring member 70 may be provided by a plurality of conductive particles or by a single conductive particle. Particularly, it is desirable to adjust the hardness of the conductive particle so that the conductive particle can be deformed by a pressure at the time of hardening the resin 90 of the adhesive layer to increase the contact area between the wiring member 70 and the bus bar electrode.

Meanwhile, the adhesive layer that bonds the bus bar electrode and the wiring member 70 does not necessarily have to contain the conductive particles 60. In a configuration where the bus bar electrode partially comes into direct contact with the wiring member 70, the electrical connection between the bus bar electrode and the wiring member 70 is to be provided at the portion where the two come into direct contact with each other. Thus, in such a configuration, the adhesive layer can be formed of only the resin 90.

Furthermore, the solar cell is not limited to one shown in FIG. 1 and FIG. 3. The solar cell may have the electrodes almost on the entire back surface, or may have a pair of positive and negative electrodes on the back surface. Meanwhile, the solar cell module may be a HIT solar cell module, or a solar cell module with other types of solar cells such as crystalline solar cells, in which a junction is formed by a generally-used thermal diffusion method.

Hence, it goes without saying that the present invention includes various embodiments and the like not described herein. The technical scope of the present invention, thus, should only be defined by the claimed elements according to the scope of claims reasonably understood from the above description.

EXAMPLES

Hereinafter, the solar cell module according to the present invention is specifically described with reference to Example. However, the present invention is not limited to Example illustrated below, and thus can be carried out appropriately while being modified without departing from the gist thereof.

Example

As a solar cell module according to Example of the present invention, one with the solar cells as shown in FIG. 3 was manufactured as follows. The solar cells according to Example are HIT solar cells.

Firstly, a resin made of an epoxy resin was mixed with silver particles at a ratio of 20:80 to 10:90 wt %, the silver particles being a mixture of approximately 1-μmφ spherical powders and approximately 10-μmφ flake powders. Thereby, a paste was prepared. The viscosity of the paste was adjusted with an organic solvent in an amount of approximately 0.5 to 5% relative to the entire content. This paste was patterned on each of the solar cells by a screen-printing method. The paste was then hardened in conditions of 200° C. for 1 hour, and thereby a collecting electrode including a bus bar electrode was formed.

Subsequently, a resin made of an epoxy resin to serve as an adhesive layer was mixed with approximately 10-μmφ spherical tin particles at a ratio of 80:20 to 95:5 wt %. Thereby, a paste was prepared. The viscosity of the paste was adjusted with an organic solvent in an amount of approximately 0.5 to 5% relative to the entire content. This paste was applied onto the bus bar electrode, and a wiring member 70 was disposed thereon. Thereafter, a pressure of 2 MPa was applied. After that, thermal treatment was conducted at 20° C. for 1 hour, and thereby the epoxy resin was hardened.

Here, the above collecting electrode and adhesive layer differ from each other in size and blending ratio of the conductive particles. The difference was made because of the following reasons. Specifically, since the collecting electrode is desired to have a low specific resistance, the size and the blending ratio of the silver particles are adjusted. As for the adhesive layer, on the other hand, the size and the blending ratio of the tin particles are adjusted in order to provide a preferable electrical connection between the bus bar electrode and the wiring member 70. Particularly, in Example, the size of the tin particles is adjusted so that individual electrical paths are provided by the single conductive particle; and the blending ratio of the tin particles and the resin 90 is adjusted to make the adhesion force between the bus bar electrode and the wiring member 70 firmer.

Meanwhile, the molecular weight of the epoxy resin of the adhesive layer is twice as high as the molecular weight of the epoxy resin of the bus bar electrode. In this Example, the chain length of the straight epoxy resin was approximately doubled. The residual stress of the epoxy resin after hardening is substantially proportional to the density of the epoxy group. Accordingly, as the molecular weight is doubled, the density of the epoxy group is reduced by half. As a result, the residual stress of the resin 90 of the adhesive layer is also reduced by approximately half.

As described above, while the solar cells pasted with the wiring members 70 were used, a glass, EVA, the solar cells, EVA, and a back-surface protection sheet were stacked in this sequence After that, thermal treatment was conducted under vacuum at 150° C. for 5 minutes to soften the EVA resin. Then, compression bonding was conducted with heat under atmospheric pressure for 5 minutes, and thus the solar cells were molded with the EVA resin. Subsequently, these were held in a high-temperature tank of 150° C. for 50 minutes to crosslink the EVA resin. In this manner, a solar cell module was manufactured.

Comparative Example

In a solar cell module manufactured according to Comparative Example, the molecular weight of an epoxy resin forming an adhesive layer as in Example was the same as the molecular weight of an epoxy resin in a bus bar electrode. Note that, except for the molecular weight, the manufacturing process for the solar cell module according to Comparative Example is the same as that in Example.

Conventional Example

Figure 4:
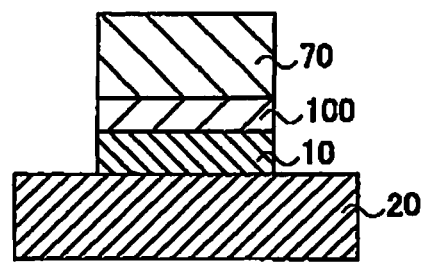
FIG. 4 is an enlarged cross-sectional view of a solar cell according to Conventional Example and FIG. 5 is an enlarged cross-sectional view of a solar cell according to a present claimed embodiment.
Figure 5:
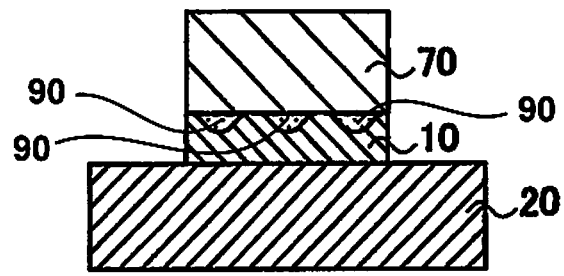

Meanwhile, as a solar cell module according to Conventional Example, a solar cell module with solar cells as shown in FIG. 4 was manufactured. In each of the solar cells according to Conventional Example, a wiring member 70 was connected to a bus bar electrode by soldering. Specifically, an organic acid flux was applied to the wiring member 70 on the solar cell side, and then the flux was dried. Thereafter, the wiring member 70 was disposed on the bus bar electrode. The solar cell and the wiring member 70 were blown with a warm air of approximately 300° C. Thereby, the solder of the wiring member 70 was alloyed with a silver paste of the bus bar electrode 10 to form an alloy layer 100.

(Temperature Cycle Test)

For each of the solar cell modules according to Example, Comparative Example, and Conventional Example, the output correlation was evaluated by comparing the module output with the module output before the wiring member was pasted (immediately after the collecting electrode was formed).

Additionally, a temperature cycle test was conducted in accordance with JIS C 8917 on the solar cell modules according to Example, Comparative Example, and Conventional Example. The JIS test specifies a cycle of −40° C. to 90° C. to be repeated 200 cycles. Nevertheless, the additional test was conducted by increasing the number of cycles up to 400 in order to evaluate a longer-period reliability.

Table 1 shows the results of the aforementioned solar cell/solar cell module output correlation and temperature cycle test.

TABLE 1

|  | Solar cell/solar cell module output correlation | Temperature cycle test | |
|---|---|---|---|
|  |  | After 200 cycles | After 400 cycles |
| Example | 99.0% | 98.5% | 98.0% |
| Comparative Example | 99.0% | 98.0% | 97.0% |
| Conventional Example | 98.5% | 98.0% | 95.5% |

Here, the value of solar cell/solar cell module output correlation focuses on F.F. that is a parameter dependent on a resistance component before and after the modularization, and indicates a value of (F. F. after the modularization)/(F. F. of the solar cells immediately after the collecting electrode was formed). Meanwhile, (Pmax after the test)/(Pmax value before the test) is shown as the result of the temperature cycle test.

As shown in Table 1, the solar cell/solar cell module output correlation is shown to increase in the sequence of Example=Comparative Example>Conventional Example. The reason is considered as follows. In Conventional Example, the flux residue and the alloy layer between the bus bar electrode and the wiring member worked as the resistance component.

Meanwhile, as for the result of the temperature cycle test (200 cycles), Comparative Example and Conventional Example showed slightly lower values than that of Example (the difference was 0.5%). After the 400 cycles, Comparative Example and Conventional Example showed further lower values than that of Example (Comparative Example: the difference was 1.0%, Conventional Example: the difference was 2.5%). In addition, after the 400 cycles, Conventional Example showed the value lower than that of Comparative Example (the difference was 1.5%). The reason why Conventional Example had the lowest value is considered as follows. Since the alloy layer was hard and the internal stress between the wiring member 70 and the solar cell was great, a crack or the like was formed between the wiring member 70 and the bus bar electrode, thus increasing the resistance component. Moreover, the reason why Comparative Example has the value lower than that of Example is considered to be that Comparative Example has the lower molecular weight and the greater residual stress than Example.

As described above, it was found out that the solar cell module according to Example makes it possible to achieve both the high solar cell/solar cell module output correlation and the longer-period tolerance in the temperature cycle test, and to restrain the decrease in the output of the solar cell module.

Other Examples

Although Example has been described regarding the HIT solar cell so far, the same conclusion can be drawn on a crystalline solar cell formed by a thermal diffusion method. To be more specific, also with a crystalline solar cell formed by the thermal diffusion method, the temperature cycle tolerance greatly differs between: a case where an adhesive layer capable of relaxing stress is provided between the solar cell (bus bar electrode) and a wiring members and a case where an alloy layer incapable of relaxing stress is provided therebetween. Particularly, in the thermal diffusion method, the hardening temperature of the resin paste is high, the residual stress is increased, and thus the temperature cycle tolerance differs more greatly.

In Example described above, the molecular weight of the epoxy resin of the adhesive layer was made twice as high as the molecular weight of the epoxy resin of the bus bar electrode to reduce the residual stress. Alternatively, even when the residual stress is reduced by subjecting the epoxy resin to the resin modification as described above, the same effects can be obtained.

Note that the entire content of Japanese Patent Application No. 2006-320219 (filed on Nov. 28, 2006) is incorporated herein by reference.

INDUSTRIAL APPLICABILITY

As has described above, a solar cell module according to the present invention can restrain a decrease in the module output, and is useful in solar power generation.

The invention claimed is:

1. A solar cell module in which a plurality of solar cells are arranged between a light-receiving surface protection member and a back-surface protection member and in which electrodes of the solar cells are electrically connected to each other through a wiring member, wherein
    each of the electrodes includes a bus bar electrode comprising a conductive resin paste that partially comes into direct contact with the wiring member along an interface between the bus bar electrode and the wiring member,
    an adhesive layer made of a resin is located along the interface between the bus bar electrode and the wiring member at non-contact portions between the bus bar electrode and the wiring member, the non-contact portions being areas along the interface wherein the bus bar electrode and the wiring member are not in direct contact with one another, and
    a residual stress of the resin of the adhesive layer is smaller than a residual stress of the resin contained in the bus bar electrode.

2. The solar cell module according to claim 1, wherein
    an average molecular weight of the resin of the adhesive layer is higher than an average molecular weight of the resin contained in the bus bar electrode, and thus the residual stress of the resin of the adhesive layer is smaller than the residual stress of resin contained in the bus bar electrode.

3. The solar cell module according to claim 1, wherein
    the resin of the adhesive layer is any one of an epoxy resin, an imide resin and a phenol resin with an elastomer mixed thereinto, and thus the residual stress of the resin of the adhesive layer is smaller than the residual stress of resin contained in the bus bar electrode.

4. The solar cell module according to claim 1, wherein the resin of the adhesive layer has a sea-island structure having a rigid adhesive resin as a main skeleton with a resin, incompatible with the rigid adhesive resin, being added thereto, and thus the residual stress of the resin of the adhesive layer is smaller than the residual stress of resin contained in the bus bar electrode.

5. The solar cell module according to claim 1, wherein the resin of the adhesive layer has a soft molecular skeleton introduced into a main skeleton of a rigid adhesive resin, and thus the residual stress of the resin of the adhesive layer is smaller than the residual stress of resin contained in the bus bar electrode.

6. A solar cell module in which a plurality of solar cells are arranged between a light-receiving surface protection member and a back-surface protection member and in which electrodes of the solar cells are electrically connected to each other through a wiring member, wherein
   each of the electrodes includes a bus bar electrode comprising a conductive resin paste that partially comes into direct contact with the wiring member along an interface between the bus bar electrode and the wiring member,
   an adhesive layer made of a resin is located along the interface between the bus bar electrode and the wiring member at non-contact portions between the bus bar electrode and the wiring member, the non-contact portions being areas along the interface wherein the bus bar electrode and the wiring member are not in direct contact with one another, and
an average molecular weight of the resin of the adhesive layer is higher than an average molecular weight of a resin contained in the bus bar electrode,
wherein the bus bar electrode partially comes into direct contact with the wiring member at portions thereof.

7. A solar cell module in which a plurality of solar cells are arranged between a light-receiving surface protection member and a back-surface protection member and in which electrodes of the solar cells are electrically connected to each other through a wiring member, wherein
   each of the electrodes includes a bus bar electrode comprising a conductive resin paste that partially comes into direct contact with the wiring member along an interface between the bus bar electrode and the wiring member,
   an adhesive layer made of a resin is located along the interface between the bus bar electrode and the wiring member at non-contact portions between the bus bar electrode and the wiring member, the non-contact portions being areas along the interface wherein the bus bar electrode and the wiring member are not in direct contact with one another, and
the resin of the adhesive layer is any one of an epoxy resin, an imide resin and a phenol resin with an elastomer mixed thereinto,
wherein the bus bar electrode partially comes into direct contact with the wiring member at portions thereof.

8. A solar cell module in which a plurality of solar cells are arranged between a light-receiving surface protection member and a back-surface protection member and in which electrodes of the solar cells are electrically connected to each other through a wiring member, wherein
   each of the electrodes includes a bus bar electrode comprising a conductive resin paste that partially comes into direct contact with the wiring member along an interface between the bus bar electrode and the wiring member,
   an adhesive layer made of a resin is located along the interface between the bus bar electrode and the wiring member at non-contact portions between the bus bar electrode and the wiring member, the non-contact portions being areas along the interface wherein the bus bar electrode and the wiring member are not in direct contact with one another, and
the resin of the adhesive layer has a sea-island structure having a rigid adhesive resin as a main skeleton with a resin, incompatible with the rigid adhesive resin, being added thereto,
wherein the bus bar electrode partially comes into direct contact with the wiring member at portions thereof.

9. A solar cell module in which a plurality of solar cells are arranged between a light-receiving surface protection member and a back-surface protection member and in which electrodes of the solar cells are electrically connected to each other through a wiring member, wherein
   each of the electrodes includes a bus bar electrode comprising a conductive resin paste that partially comes into direct contact with the wiring member along an interface between the bus bar electrode and the wiring member,
   an adhesive layer made of a resin is located along the interface between the bus bar electrode and the wiring member at non-contact portions between the bus bar electrode and the wiring member, the non-contact portions being areas along the interface wherein the bus bar electrode and the wiring member are not in direct contact with one another, and
   the resin of the adhesive layer has a soft molecular skeleton introduced into a main skeleton of a rigid adhesive resin,
wherein the bus bar electrode partially comes into direct contact with the wiring member at portions thereof.

* * * * *